United States Patent
Hsu et al.

(10) Patent No.: US 11,064,632 B2
(45) Date of Patent: Jul. 13, 2021

(54) HEAT-SINKING IMPROVED STRUCTURE FOR EVAPORATORS

(71) Applicant: LDC PRECISION ENGINEERING CO., LTD., New Taipei (TW)

(72) Inventors: Chi-Feng Hsu, New Taipei (TW); Cheng-Jen Liang, New Taipei (TW); Chih-Wei Chen, New Taipei (TW)

(73) Assignee: LDC PRECISION ENGINEERING CO., LTD., New Taipei (TW)

( * ) Notice: Subject to any disclaimer, the term of this patent is extended or adjusted under 35 U.S.C. 154(b) by 0 days.

(21) Appl. No.: 16/562,430

(22) Filed: Sep. 5, 2019

(65) Prior Publication Data

US 2021/0076536 A1    Mar. 11, 2021

(51) Int. Cl.
| | |
|---|---|
| *H05K 7/20* | (2006.01) |
| *H01L 23/427* | (2006.01) |
| *F28F 3/14* | (2006.01) |
| *H01L 23/367* | (2006.01) |
| *F28D 15/02* | (2006.01) |

(52) U.S. Cl.
CPC ..... *H05K 7/20309* (2013.01); *F28D 15/0266* (2013.01); *F28F 3/14* (2013.01); *H01L 23/3672* (2013.01); *H01L 23/427* (2013.01); *H05K 7/20318* (2013.01)

(58) Field of Classification Search
CPC ........... H05K 7/20218; H05K 7/20254; H05K 7/2029; H05K 7/20309; H05K 7/20318; H05K 7/20336; H05K 7/2039; H05K 7/20472; H01L 23/367; H01L 23/3672; H01L 23/427; H01L 23/473; F28F 3/02; F28F 3/025; F28F 3/027; F28F 3/14; F28D 15/026; F28D 15/0266; F28D 15/04; F28D 15/046
USPC .......... 165/80.2, 80.3, 104.33, 185; 361/700, 361/702, 703, 709, 710
See application file for complete search history.

(56) References Cited

U.S. PATENT DOCUMENTS

| | | | | |
|---|---|---|---|---|
| 4,729,428 | A * | 3/1988 | Yasutake | F28D 9/0062 165/153 |
| 6,607,023 | B2 * | 8/2003 | Ho | H01L 23/3672 165/185 |
| 6,672,379 | B1 * | 1/2004 | Wang | F28F 3/02 165/185 |
| 6,765,799 | B1 * | 7/2004 | Huang | H01L 23/3672 165/185 |
| 7,025,122 | B2 * | 4/2006 | You-Tien | F28F 1/30 165/185 |

(Continued)

*Primary Examiner* — Len Tran
*Assistant Examiner* — Gustavo A Hincapie Serna
(74) *Attorney, Agent, or Firm* — Chun-Ming Shih; Lanway IPR Services

(57) ABSTRACT

A heat-sinking improved structure for evaporators includes at least one heat-sinking component having an outer wall board; an inner wall board extending upwards at the bottom of the outer wall board and dividing the lower portion of the interior of the outer wall board to form two water evaporation areas, and a gas concentration area formed at the top portion of the interior of the outer wall board; then, continuously arranging and combining such a plurality of heat-sinking components in the same direction thereby constituting a heat-sinking module which can be installed and sealed within an outer case in order to operate as a heat-sinking improved structure for the evaporator.

8 Claims, 10 Drawing Sheets

(56) References Cited

U.S. PATENT DOCUMENTS

| | | | |
|---|---|---|---|
| 2002/0074105 A1* | 6/2002 | Hayashi | F02M 26/32 |
| | | | 165/43 |
| 2010/0095659 A1* | 4/2010 | Kuroyanagi | F02B 29/0418 |
| | | | 60/320 |
| 2011/0005726 A1* | 1/2011 | Zhang | F28D 15/0275 |
| | | | 165/104.26 |
| 2014/0238006 A1* | 8/2014 | Iwasaki | F02M 26/32 |
| | | | 60/320 |
| 2014/0307392 A1* | 10/2014 | Kurz | H01L 23/552 |
| | | | 361/720 |
| 2018/0058657 A1* | 3/2018 | Duarte | F21S 41/30 |
| 2018/0063998 A1* | 3/2018 | Aoki | G06F 1/203 |
| 2018/0195816 A1* | 7/2018 | Moriyama | F28F 13/18 |
| 2018/0299210 A1* | 10/2018 | Ronacher | F28F 3/025 |
| 2019/0115519 A1* | 4/2019 | Matsuda | H01L 23/473 |
| 2019/0204025 A1* | 7/2019 | Tsai | F28F 3/08 |
| 2019/0320551 A1* | 10/2019 | Kao | F28F 3/083 |
| 2019/0360766 A1* | 11/2019 | Kenney | F28F 3/027 |
| 2019/0393132 A1* | 12/2019 | Tamura | H01L 23/473 |
| 2020/0149830 A1* | 5/2020 | Lin | H01L 23/3672 |
| 2020/0166278 A1* | 5/2020 | Satou | F28F 1/02 |
| 2020/0217595 A1* | 7/2020 | Wu | F28D 15/04 |

* cited by examiner

HEAT-SINKING IMPROVED STRUCTURE FOR EVAPORATORS

BACKGROUND OF THE INVENTION

1. Field of the Invention

The present invention relates to a heat-sinking improved structure for evaporators which can be used as a heat dissipation structure capable of performing liquid/gas conversions in order to achieve the intended heat dissipation effect.

2. Description of Related Art

In recent years, the heat generation of electronic components has been increasing rapidly with the precision improvements of semiconductor processes. Therefore, how to enhance the heat-sinking capability of electronic components in order to maintain the normal operations of components has become a very important engineering issue.

Currently, the comprehensively applied direct air-cooling technology may not be able to meet the heat dissipation requirements of various electronic components having high heat flux features. In addition to the air-cooling technology, the liquid/gas conversion using water may achieve the intended heat dissipation effect as well. This technology provides two sets of heat spreaders and two sets of connected pipes, in which one set of heat spreaders is used to evaporate in order to remove the absorbed heat, while the other set of heat spreaders used to condense so as to cool down to bring back the output cooling water for subsequent heat dissipation loops. It should be seen that the pressures in such two sets of heat spreaders are different, so the water can be automatically transported back and forth during operations. However, the interior of the above-said heat spreaders mostly comprises a simple fin or flow channel design for enabling water circulation therein, which makes the internal liquid/gas conversion effectiveness of the water quite limited.

Therefore, with regard to the design and improvement of the internal flow channel structure thereof, it is desirable to add more water evaporation and gas concentration space, and to increase the liquid/gas conversion effectiveness, so the solution for the heat-sinking improvement structure of the evaporator according to the present invention has been provided.

SUMMARY OF THE INVENTION

A heat-sinking improved structure for evaporators according to the present invention comprises: at least one heat-sinking component, including an outer wall board which is respectively installed with a first board surface, a second board surface and a third board surface, wherein the second board surface and the third board surface are individually located on the two opposite sides of the first board surface such that the second board surface and the third board surface individually form a preset angle with respect to the first board surface so that the interior of the outer wall board forms a semi-open space; in addition, an inner wall board extends upwards at the bottom of the outer wall board and is applied to divide the lower portion of the interior of the outer wall board to form two water evaporation areas, and also a gas concentration area is formed at the top portion of the interior of the outer wall board; accordingly, such a plurality of heat-sinking components can be continuously arranged and combined in the same direction thereby constituting a heat-sinking module which can be installed and sealed within an outer case in order to operate as a heat-sinking improved structure for the evaporator. It can be appreciated that, since the inner wall boards divide the heat-sinking module into more water evaporation areas, the thermal energy has more contact area to travel into the water, thus effectively improving the heat dissipation benefit; in addition, the water is shunted in each of the water evaporation areas, heating in each area can make the water evaporate faster, thus enhancing the evaporation efficiency.

More specifically, the first board surface, the second board surface and the third board surface are manufactured integrally in one piece or fixedly connected to each other.

More specifically, the second board surface and the third board surface individually form a 90° angle with respect to the first board surface.

More specifically, the inner wall board is formed by extending upwards the second board surface.

More specifically, a bottom board having a preset length extends outwards at the bottom of the outer wall board corresponding to the both sides of the inner wall board, and a channel is formed between each of the bottom board and the inner wall board.

More specifically, the outer wall board thickness of the outer wall board is equal to the inner wall board thickness of the inner wall board.

More specifically, the width of the water evaporation area is 1-5 times of the outer wall board thickness of the outer wall board.

More specifically, the inner wall board height of the inner wall board is equal to 0.3-0.7 times of the total height of the outer wall board.

More specifically, the upper end of the inner wall board is respectively formed with massive first protrusions and second protrusions, wherein the first protrusions are formed by extending inwards the top end of the inner wall board for a preset length, and the second protrusions are formed by extending outwards the top end of the inner wall board for a preset length.

More specifically, each of the first protrusions and each of the second protrusions are mutually offset such that the top surface of the inner wall board becomes continuously bow-shaped.

More specifically, the inner wall board is formed on another wall board, with the two ends of the wall board being assembled to the two ends of the outer wall board, in which a notch is configured on the inner wall board and is used to form the air concentration area in the top part of the interior of the outer wall board.

DETAILED DESCRIPTION OF THE PREFERRED EMBODIMENTS

Other technical contents, aspects and effects in relation to the present invention can be clearly appreciated through the detailed descriptions concerning the preferred embodiments of the present invention in conjunction with the appended drawings.

Figure 1:
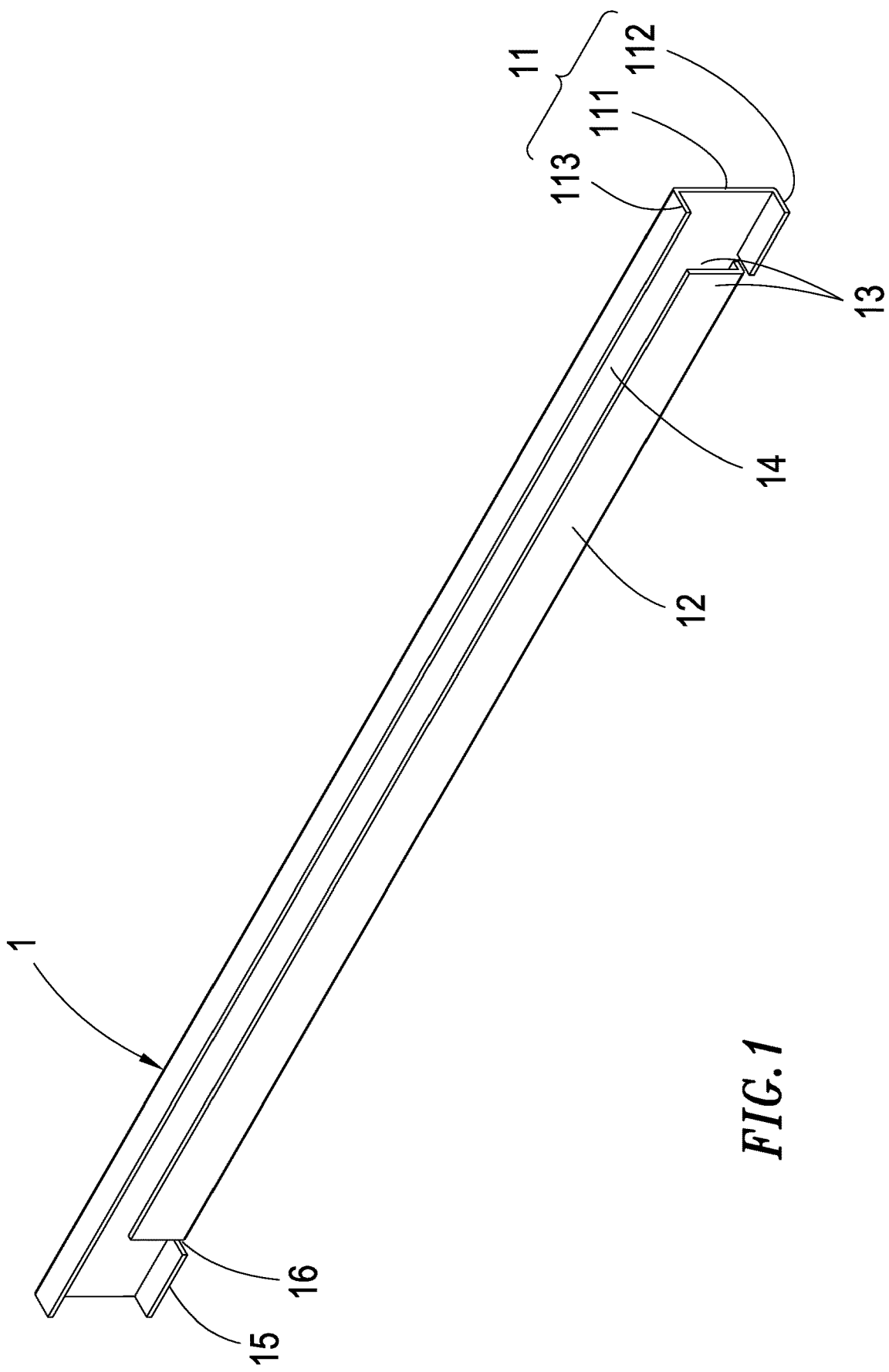
FIG. 1 shows a stereo view of the heat-sinking component in the evaporator according to the present invention.
Figure 2:
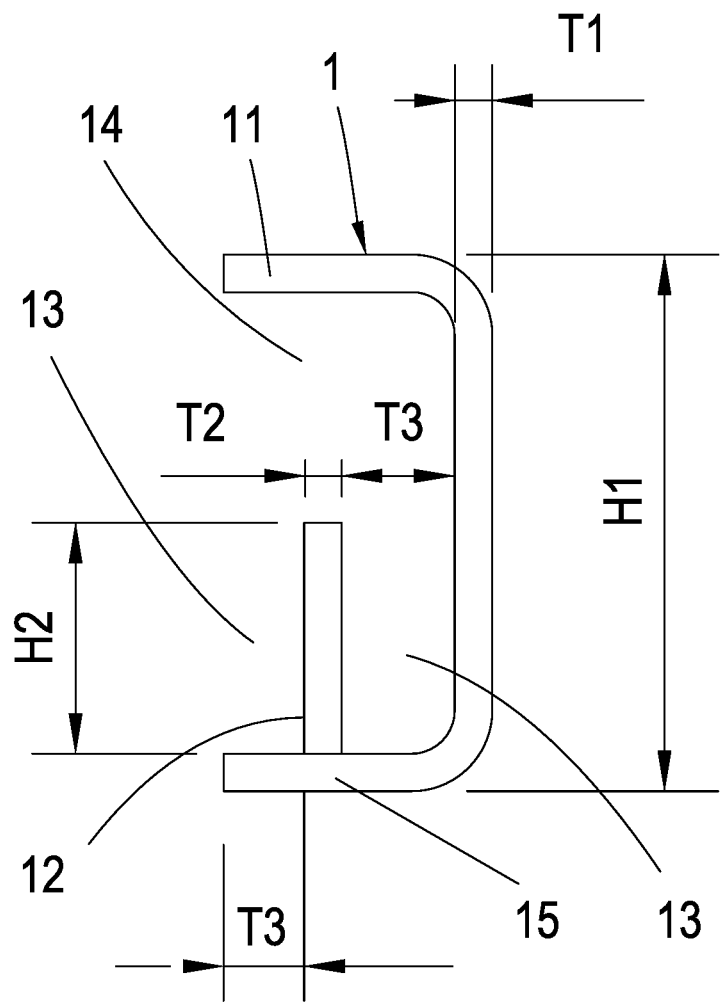
FIG. 2 shows a planar view of the heat-sinking component in the evaporator according to the present invention.

Refer first to FIGS. 1 and 2, wherein a stereo view and a planar view of the heat-sinking component in the evaporator according to the present invention are respectively shown, comprising a heat-sinking component 1.

Herein the heat-sinking component 1 includes an outer wall board 11. In the present embodiment, the outer wall board 11 is respectively installed with a first board surface 111, a second board surface 112 and a third board surface 113; i.e., the first board surface 111, the second board surface 112 and the third board surface 113 are manufactured integrally in one piece or fixedly connected to each other thereby forming the outer wall board 11, wherein the second board surface 112 and the third board surface 113 are individually located on the two opposite sides of the first board surface 111 such that the second board surface 112 and the third board surface 113 individually form a 90° angle with respect to the first board surface 111 (but the angle may be configured to a range of 60°-120°) so that the interior of the outer wall board 11 forms a semi-open space. Moreover, an inner wall board 12 having a preset height extends upwards at the bottom of the outer wall board 11 (i.e., opposite to the second board surface 112 in the present embodiment) and is applied to divide the lower portion of the interior of the outer wall board 11 to form two water evaporation areas 13, and a gas concentration area 14 can be also created at the top portion of the interior of the outer wall board 11 at the same time. Besides, a bottom board 15 having a preset length extends outwards at the bottom of the outer wall board 11 corresponding to the both sides of the inner wall board 12, and a channel 16 is formed between each of the bottom board 15 and the inner wall board 12.

Figure 3:
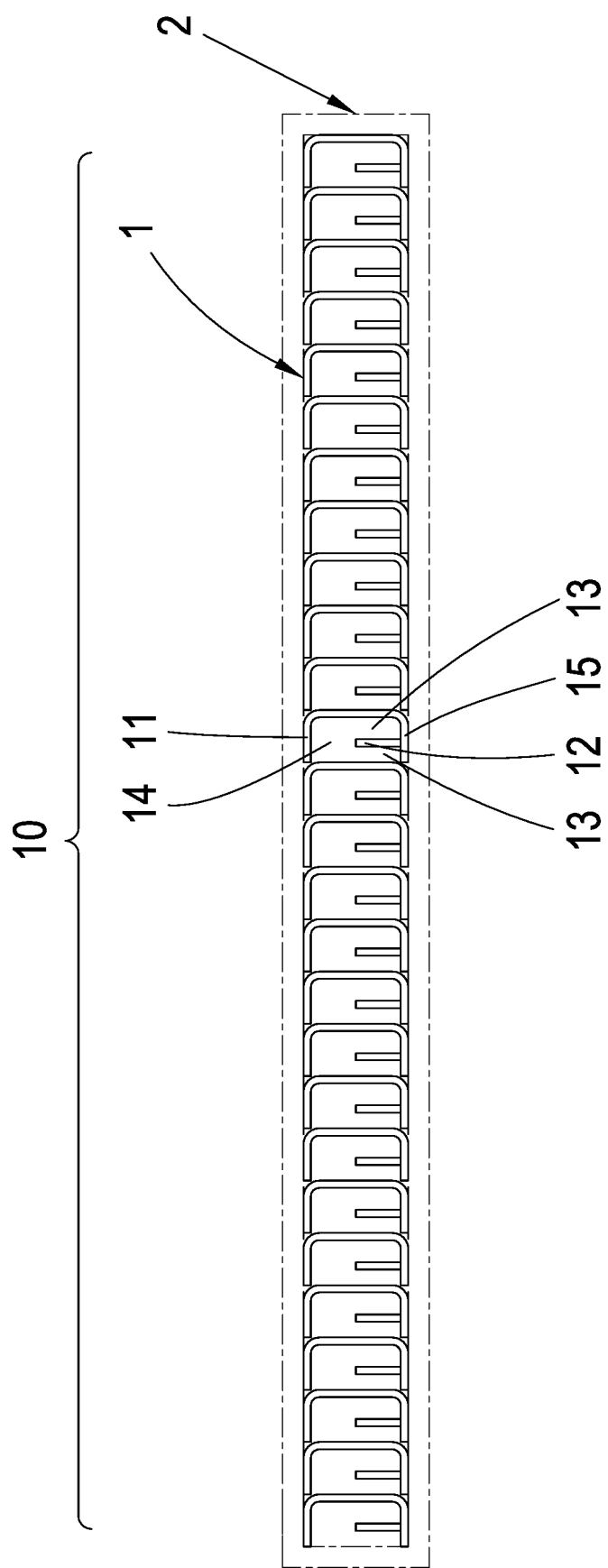
FIG. 3 shows a cross-sectioned view of the heat-sinking module in the evaporator according to the present invention.

Refer next to FIG. 3, it can be observed that such a plurality of heat-sinking components 1 can be continuously arranged and combined in the same direction thereby constituting a heat-sinking module 10 which can be installed and sealed within an outer case 2 so as to operate as a heat-sinking improved structure for the evaporator of a condenser in practice.

Figure 4:
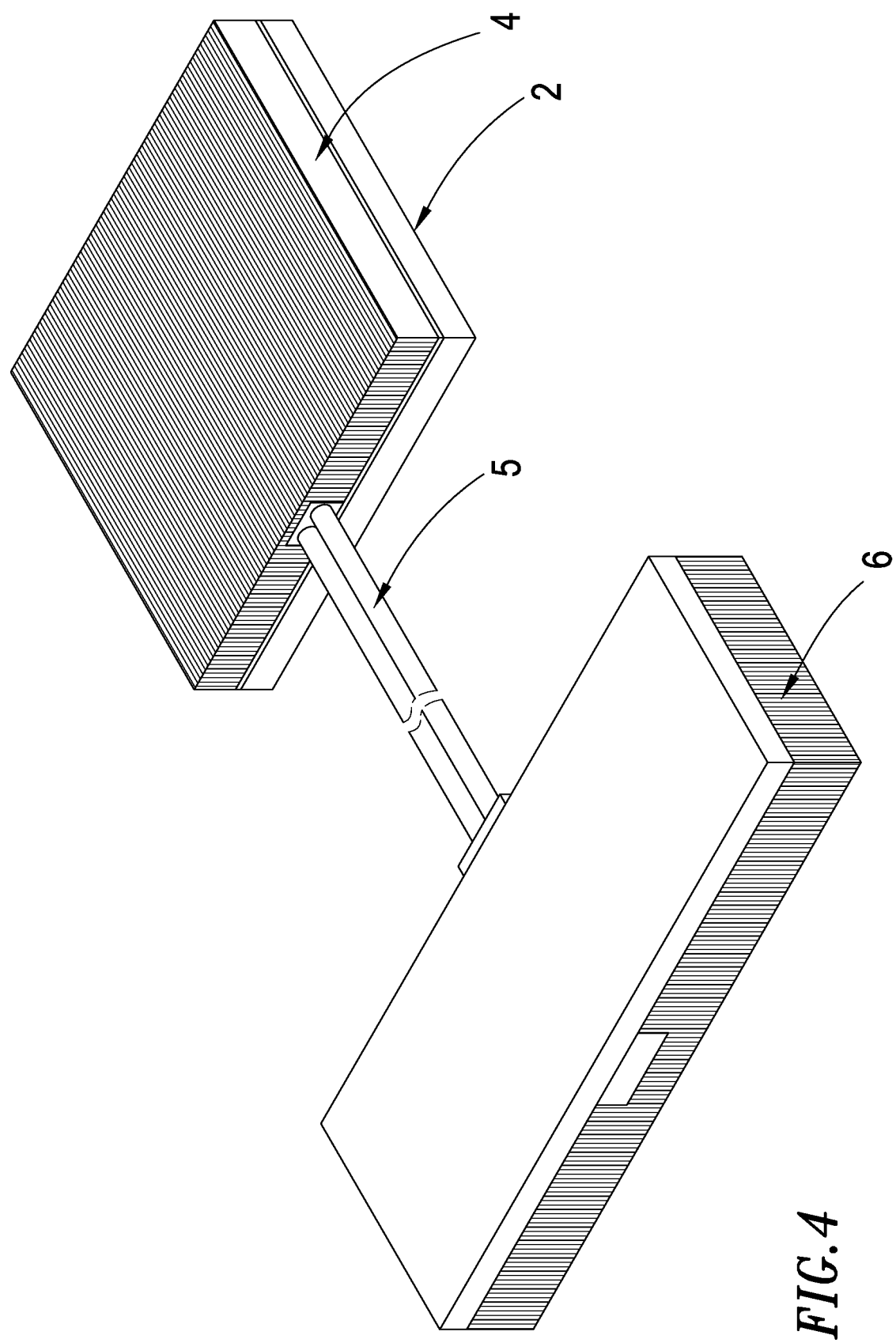
FIG. 4 shows a stereo view of the heat-sinking module in the evaporator according to the present invention, in combination with a condenser in use.
Figure 5:
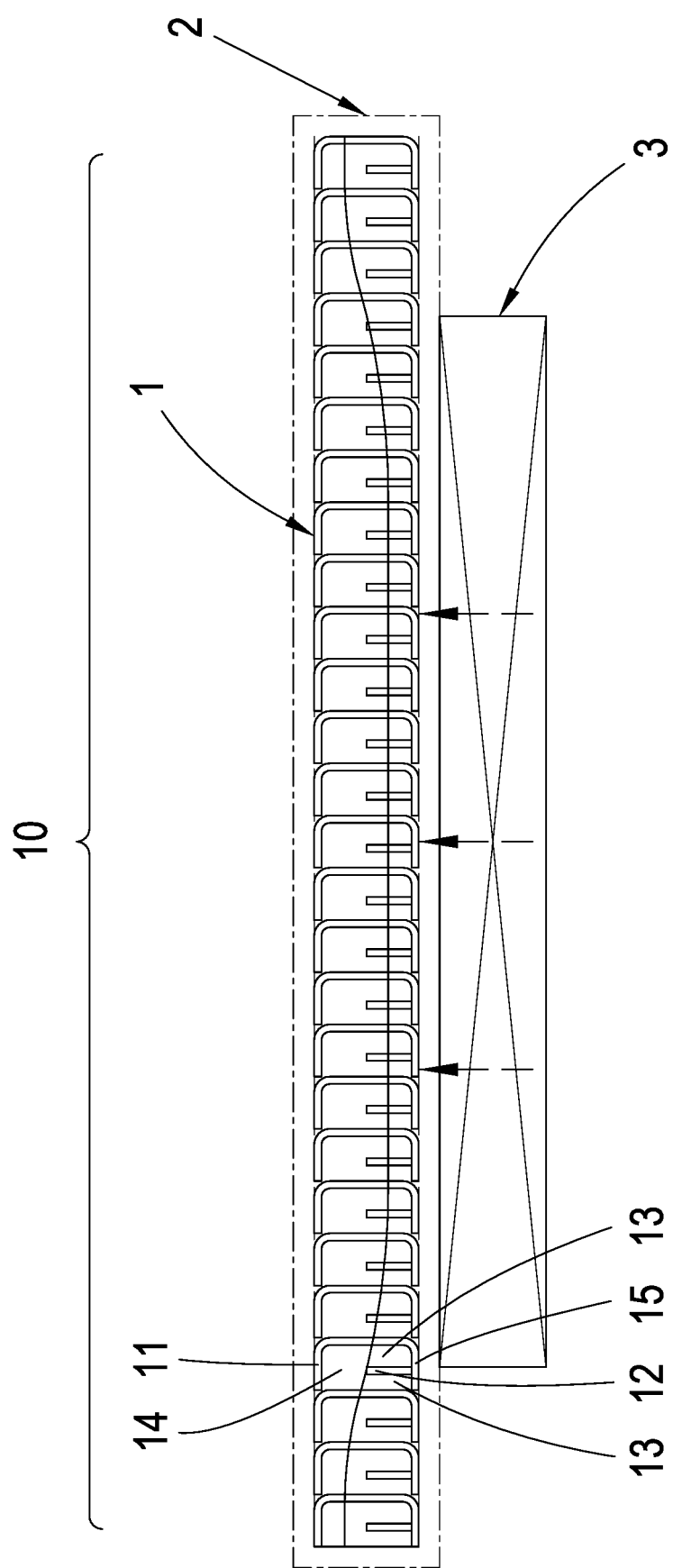
FIG. 5 shows a cross-sectioned view of the heat-sinking implementation for the heat-sinking module in the evaporator according to the present invention.
Figure 6:
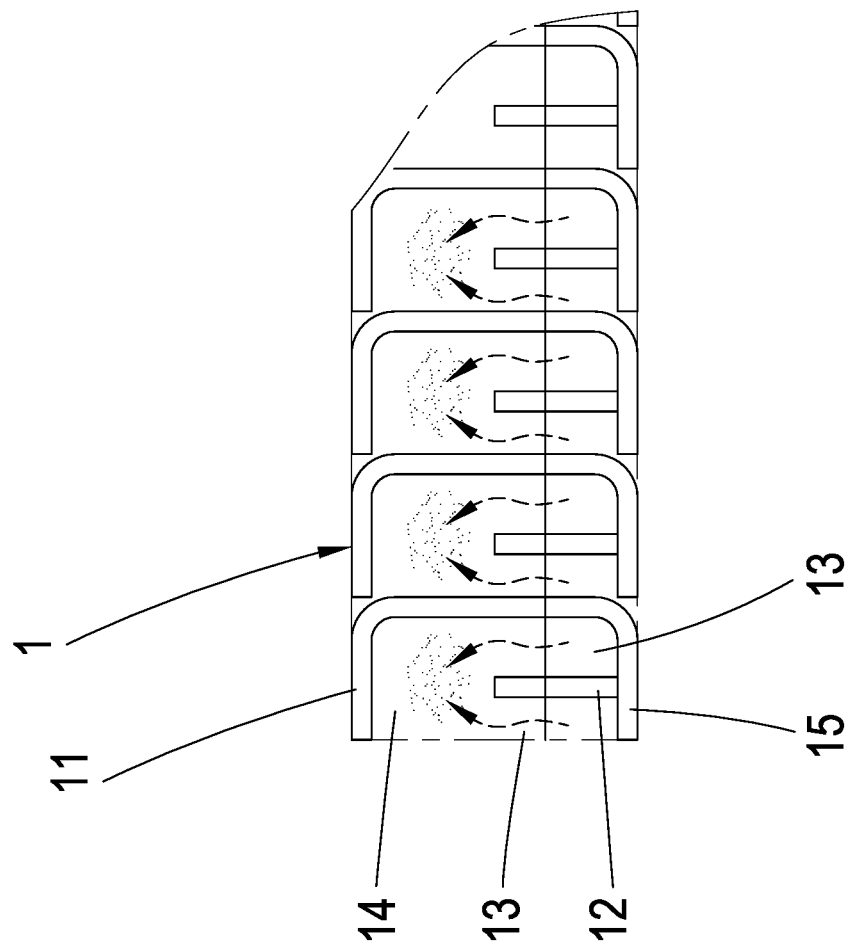
FIG. 6 shows a partially cross-sectioned view of the heat-sinking implementation for the heat-sinking module in the evaporator according to the present invention.

Subsequently, refer to FIGS. 4-6; in use, the heat-sinking module 10 has a certain predetermined water within each of the water evaporation areas 13, and the rear section of the bottom of the outer case 2 may be fixedly configured in lock with a heat source 3 (e.g., CPU or other electronic products etc.); besides, the outer case 2 can be also conjunctively installed with heat-sinking fins 4 and a connection tube 5, and the connection tube 5 can be further connected to a condenser 6. In this way, when the heat source 3 generates heat energy, the heat energy generated by the heat source 3 can be conducted to the inside of the outer case 2 and then into the heat-sinking module 10, such that the water in each of the water evaporation areas 13 can be heated to evaporate; the gas containing evaporated water will move and concentrate in the are concentration areas 14, thus further flowing into the condenser 7 by way of the connection tube 6. In contrast, the gaseous water enters the condenser 7 and turns into water after being cooled, which afterwards returns to the heat-sinking module 10 via the connection pipe 6.

Refer back to FIGS. 1 and 2. In the present embodiment, the heat-sinking component 1 has a predetermined proportional configuration, in which the outer wall board thickness T1 of the outer water board 11 is deemed as the reference base (i.e., in the present embodiment, the thickness of the first board surface 111, the second board surface 112 and the third board surface 113 are set to be equal and based on the outer wall board thickness T1); meanwhile, the inner wall board thickness T2 of the inner wall board 12 is equal to the outer wall board thickness T1, and the evaporation area width T3 of the water evaporation area 13 is 1-5 times of the outer wall board thickness T1. Furthermore, the total height H1 of the outer wall board 11 is set to be the reference base, and the inner wall height H2 of the inner wall board 12 is equal to 0.3-0.7 times of the total height H1 (which may selectively be 0.3, 0.4, 0.5, 0.6, 0.7 times).

Figure 7:
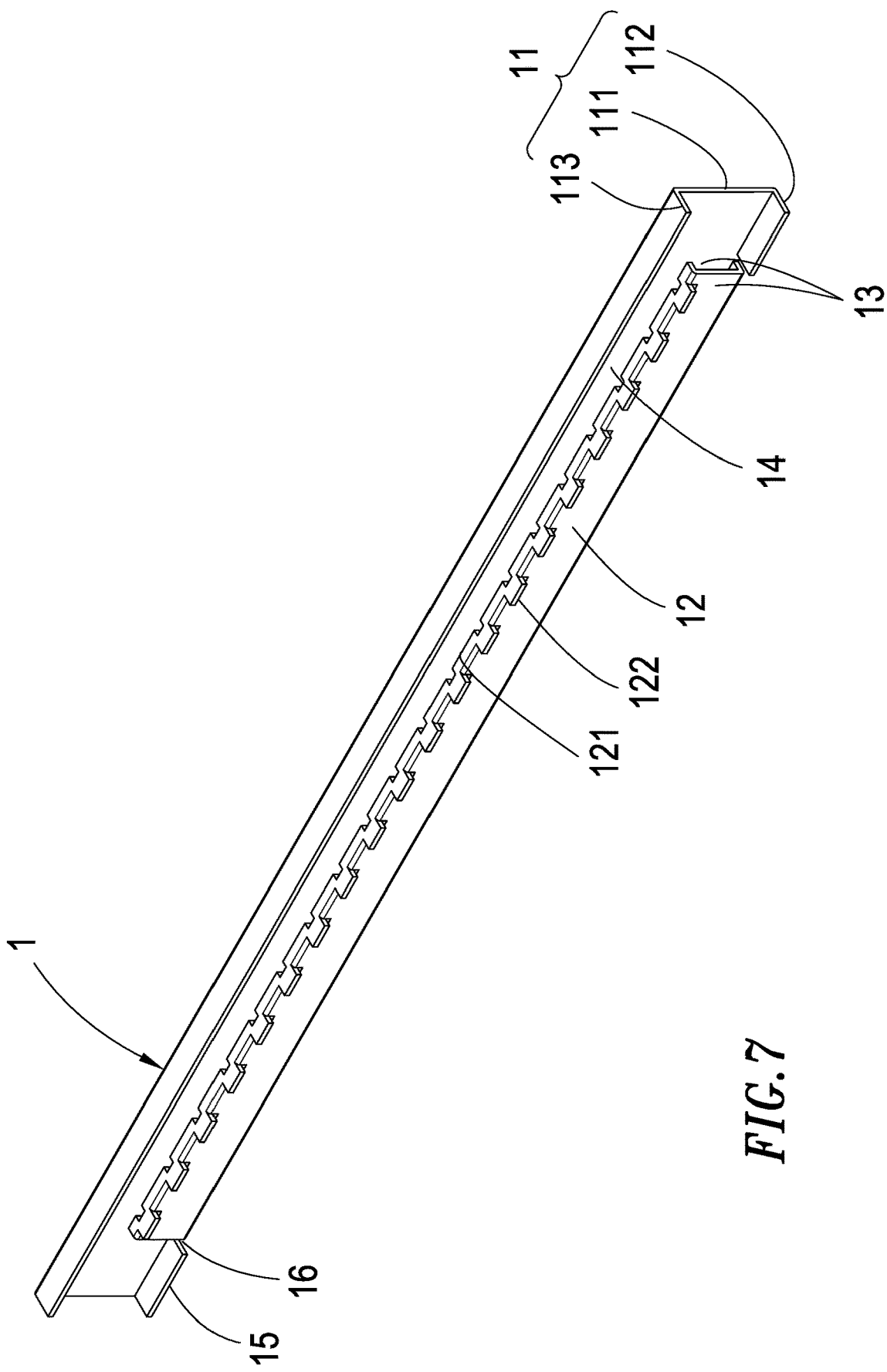
FIG. 7 shows a stereo view of the heat-sinking component in another embodiment of the evaporator according to the present invention.
Figure 8:
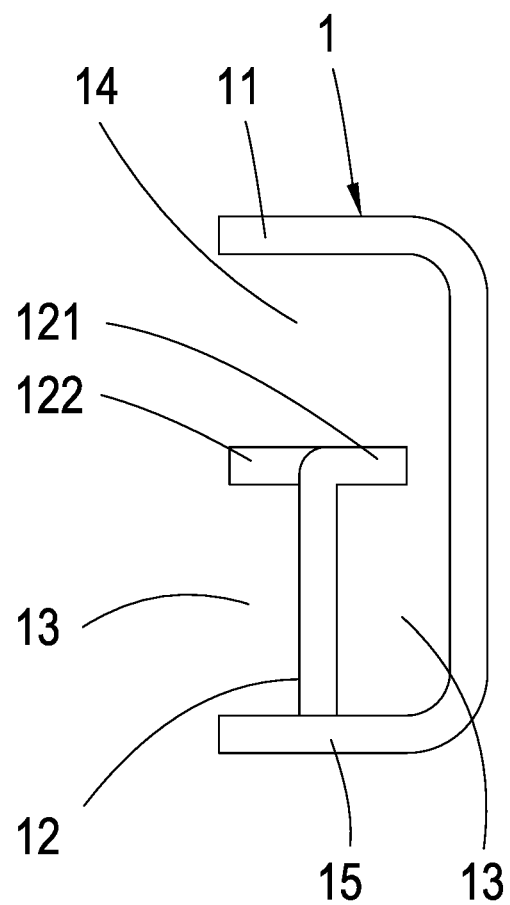
FIG. 8 shows a planar view of the heat-sinking component in another embodiment of the evaporator according to the present invention.
Figure 9:
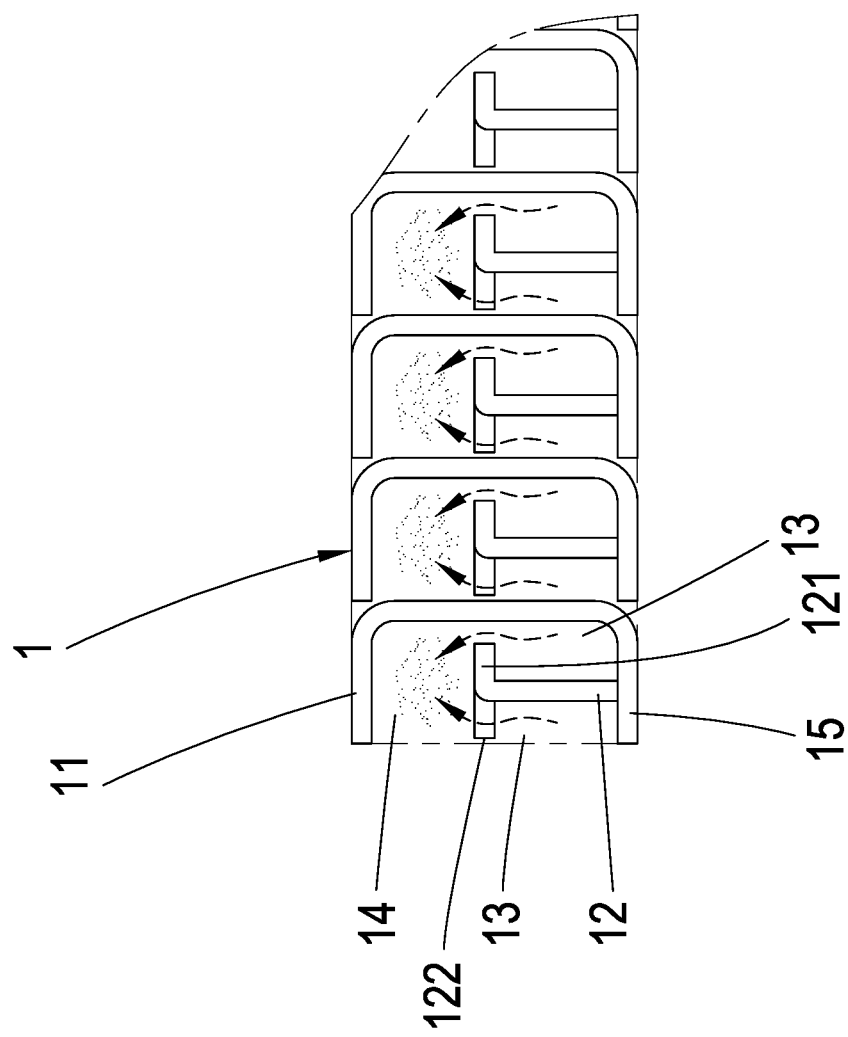
FIG. 9 shows a partially cross-sectioned view of the heat-sinking implementation for the heat-sinking module in another embodiment of the evaporator according to the present invention.

Refer next to FIGS. 7-9, wherein a second embodiment of the heat-sinking improved structure for evaporators according to the present invention is shown. It can be seen from the Figures that, the upper end of the inner wall board 12 is respectively formed with massive first protrusions 121 and second protrusions 122, wherein the first protrusions 121 are formed by extending inwards the top end of the inner wall board 12 for a preset length, and the second protrusions 122 are formed by extending outwards the top end of the inner wall board 12 for a preset length; in addition, each of the first protrusions 121 and each of the second protrusions 122 are mutually offset such that the top surface of the inner wall board 12 becomes continuously bow-shaped. Accordingly, the shielding feature in each of the first protrusions 121 and each of the second protrusions 122 can effectively elevate the pressure when the heated water becomes gaseous in each of the water evaporation areas 13, thereby allowing the gaseous water to faster flow to the air concentration areas 14 so as to increase its circulation efficiency.

Figure 10:
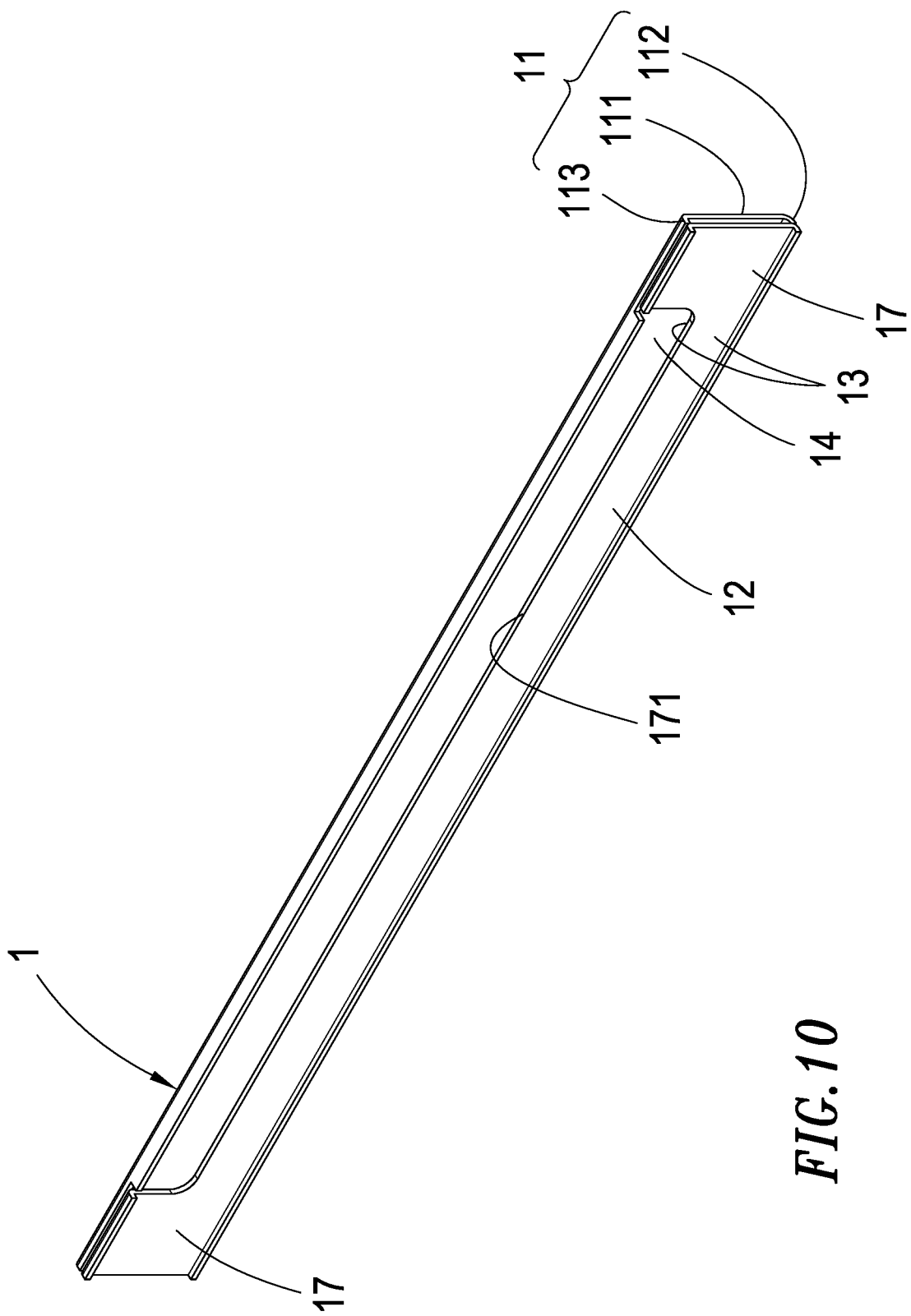
FIG. 10 shows a stereo view of the heat-sinking component in a yet another embodiment of the evaporator according to the present invention.

Refer further to FIG. 10 for a heat-sinking improved structure for evaporators according to the present invention, wherein a third embodiment thereof is shown, and the inner wall board 12 is formed on another wall board 17, with the two ends of the wall board 17 being assembled to the two ends of the outer wall board 11, in which a notch 171 is configured on the inner wall board 12 and is used to form the air concentration area 14 in the top part of the interior of the outer wall board 11.

In comparison with other conventional technologies, the heat-sinking improved structure for evaporators according to the present invention provides the following advantages:

1. Since the heat-sinking module is configured to have more water evaporation areas divided by the inner wall boards in the present invention, the thermal energy may have greater contact areas to be guided to the water for dissipation, thus improving heat-sinking efficiency thereof.

2. The water is divided into each of the water evaporation areas, and individual heating can also facilitate faster water evaporation, thereby elevating the performance of evaporation.

3. Initially, the vaporized gaseous water will be concentrated individually in each of the air concentration areas, which tends to generate a large air pressure, such that, when the gas is leaving, it can flow more quickly to the condenser having a smaller pressure, in order to promote the circulation effectiveness of the air and the water.

The present invention has been disclosed by means of the aforementioned embodiments which are merely certain preferred implementations of the present invention rather than being used to limit the scope thereof; those who are skilled in the relevant technical fields can, after understanding the technical features and embodiments of the present invention as explained hereinabove, certainly make equivalent changes, alterations or modifications without departing from the spirit and scope of the present invention, which are nonetheless deemed as falling within the coverage of the present invention; accordingly, the scope of the present invention to be protected by patent laws is subject to the definition of the claims attached to this specification.

What is claimed is:

1. A heat-sinking improved structure for evaporators, comprising:

a heat-sinking component, including an outer wall board which is respectively installed with a first board surface, a second board surface and a third board surface, wherein the second board surface and the third board surface are individually located on the two opposite sides of the first board surface such that the second board surface and the third board surface individually form a preset angle with respect to the first board surface so that the interior of the outer wall board forms a semi-open space; in addition, an inner wall board extends upwards at the bottom of the second board surface of the outer wall board and is applied to divide a lower portion of the interior of the outer wall board to form two water evaporation areas, and also a gas concentration area is formed at the top portion of the interior of the outer wall board;

accordingly, such a plurality of heat-sinking components can be continuously arranged and combined in the same direction thereby constituting a heat-sinking module which can be installed and sealed within an outer case in order to operate as a heat-sinking improved structure for the evaporator, wherein the upper end of the inner wall board is respectively formed with first protrusions and second protrusions, wherein the first protrusions are formed by extending inwards the top end of the inner wall board for a preset length, and the second protrusions are formed by extending outwards the top end of the inner wall board for a preset length.

2. The heat-sinking improved structure for evaporators according to claim 1, wherein the first board surface, the second board surface and the third board surface are manufactured integrally in one piece or fixedly connected to each other.

3. The heat-sinking improved structure for evaporators according to claim 1, wherein the inner wall board is formed by extending upwards the second board surface.

4. The heat-sinking improved structure for evaporators according to claim 1, wherein a bottom board, having a preset length extending outwards at the bottom of the outer wall board, is arranged at two sides of the inner wall board, and a channel is formed between each of the bottom boards and the inner wall board.

5. The heat-sinking improved structure for evaporators according to claim 1, wherein the outer wall board thickness of the outer wall board is equal to the inner wall board thickness of the inner wall board.

6. The heat-sinking improved structure for evaporators according to claim 1, wherein the width of each evaporation area is 1-5 times of the outer wall board thickness of the outer wall board.

7. The heat-sinking improved structure for evaporators according to claim 1, wherein the inner wall board height of the inner wall board is equal to 0.3-0.7 times of the total height of the outer wall board.

8. The heat-sinking improved structure for evaporators according to claim 1, wherein each of the first protrusions and each of the second protrusions are mutually offset, wherein the first protrusions and the second protrusions form a strip of protrusions at the top end of the inner wall board.

* * * * *